United States Patent
Kimbara et al.

(10) Patent No.: US 6,479,760 B2
(45) Date of Patent: Nov. 12, 2002

(54) PRINTED WIRING BOARD FOR SEMICONDUCTOR PLASTIC PACKAGE

(75) Inventors: Hidenori Kimbara, Tokyo (JP);
Nobuyuki Ikeguchi, Tokyo (JP);
Katsuji Komatsu, Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 0 days.

(21) Appl. No.: 09/973,688

(22) Filed: Oct. 11, 2001

(65) Prior Publication Data
US 2002/0039644 A1 Apr. 4, 2002

Related U.S. Application Data

(62) Division of application No. 09/498,482, filed on Feb. 4, 2000.

(30) Foreign Application Priority Data

Feb. 15, 1999 (JP) .............................................. 11-36365
Mar. 30, 1999 (JP) .............................................. 11-89782

(51) Int. Cl.$^7$ ................................................. H05K 1/16
(52) U.S. Cl. ........................ 174/260; 174/256; 174/262; 174/258; 361/760; 361/746; 361/783; 257/737; 257/778; 257/784
(58) Field of Search ................................. 174/260, 255, 174/264, 266, 258, 259, 262, 263, 267, 254, 256; 361/760, 748, 749, 750, 773, 783, 792, 793, 808, 743, 746, 767, 768, 772; 257/737, 738, 778, 784, 774, 698, 702, 709

(56) References Cited

U.S. PATENT DOCUMENTS 5,313,365 A    5/1994  Pennisi et al.
5,402,314 A *  3/1995  Amago et al. .............. 361/760
5,535,101 A    7/1996  Miles et al.
5,612,576 A *  3/1997  Wilson et al. .............. 257/788
5,640,047 A *  6/1997  Nakashima ................. 257/738

(List continued on next page.)

FOREIGN PATENT DOCUMENTS

JP          10-294400      11/1998
JP          2000-183535     6/2000

*Primary Examiner*—David L. Talbott
*Assistant Examiner*—J B Patel
(74) *Attorney, Agent, or Firm*—Wenderoth, Lind & Ponack, L.L.P.

(57) ABSTRACT

Provided is a printed wiring board for a chip size scale package, which overcomes the poor adhesion of solder balls to a base material which poor adhesion is caused by a recent decrease in the size of the solder balls, and in the chip size scale package, the distortion of the printed wiring board is decreased and the distortion of a semiconductor package formed by mounting a semiconductor chip on the printed wiring board by wire bonding or flip chip bonding is decreased. The printed wiring board has, as a substrate for a chip scale package, a double-side copper-clad laminate formed of an insulation layer and having copper foils on both surfaces, wherein the double-side copper-clad laminate has an upper copper foil surface and a lower copper foil surface, the upper copper foil surface has a wire bonding or flip chip bonding terminal and has a copper pad in a position where the copper pad can be electrically connected to said wire bonding or flip chip bonding terminal and can be connected to a blind via hole formed in the lower copper surface, the lower copper foil surface has a solder-balls fixing pad in a position corresponding to said copper pad, the solder-balls-fixing pad has at least 2 blind via holes within itself, and the solder-balls-fixing pad connected to a reverse surface of the copper pad with a conductive material is electrically connected with solder balls which are melted and filled in blind via holes so as to be mounded.

7 Claims, 2 Drawing Sheets

U.S. PATENT DOCUMENTS

| | | | |
|---|---|---|---|
| 5,739,588 A | * 4/1998 | Ishida et al. | 257/782 |
| 5,808,873 A | * 9/1998 | Celaya et al. | 361/760 |
| 5,831,219 A | 11/1998 | Kobayashi et al. | |
| 5,841,194 A | * 11/1998 | Tsukamoto | 257/729 |
| 5,864,470 A | * 1/1999 | Shim et al. | 361/777 |
| 5,879,787 A | 3/1999 | Petefish | |
| 5,886,876 A | 3/1999 | Yamaguchi | |
| 6,013,953 A | * 1/2000 | Nishihara et al. | 257/778 |
| 6,038,137 A | * 3/2000 | Bhatt et al. | 361/795 |
| 6,054,755 A | * 4/2000 | Takamichi et al. | 257/667 |
| 6,097,089 A | 8/2000 | Gaku et al. | |
| 6,157,085 A | * 12/2000 | Terashima | 257/783 |
| 6,160,313 A | 12/2000 | Takashima et al. | |
| 6,175,152 B1 | 1/2001 | Toyoda | |

* cited by examiner

PRINTED WIRING BOARD FOR SEMICONDUCTOR PLASTIC PACKAGE

This is a divisional of Ser. No. 09/498,482, filed Feb. 4, 2000.

FIELD OF THE INVENTION

The present invention relates to a printed wiring board for a semiconductor plastic package. More specifically, it relates to a printed wiring board for a chip scale package (CSP) formed of a semiconductor chip mounted on a small-sized printed wiring board having almost the same size as the semiconductor chip, and particularly, it relates to a printed wiring board for a very thin ball grid array (BGA) type plastic package.

The printed wiring board as an end product of the present invention, with a semiconductor chip on it, is used in/as a micro-controller, an application specific IC (ASIC), a memory, or the like. The above package is connected to a mother board printed wiring board with solder balls and used in an electronic machine or equipment.

DESCRIPTION OF PRIOR ART

A conventional base material for the chip scale package (CSP) is mainly selected from thin sheets formed of a glass epoxy material, a polyimide film material and a ceramic material. In packages formed of these sheets, a solder ball/solder ball distance is 0.8 mm or more, and yet, it is attempted to decrease the thickness, the size and the weight of the packages. In recent years, therefore, solder balls are getting smaller and smaller in diameter, and the solder ball pitch and the line/space distance of a circuit are decreasing. The above tendency causes problems on heat resistance of a substrate and electric insulation of a multi-layered board after water absorption and anti-migration properties.

In a conventional plastic ball grid array (P-BGA) and CSP, the adhesion of solder balls to a base material decreases with a decrease in the size of a solder ball pad, which causes defective products. Further, since a substrate has a small thickness, a printed wiring board inevitably undergoes distortion due to a variability of thickness of solder resists on front and reverse surfaces of a substrate and a difference in residual ratios of copper foils.

SUMMARY OF THE INVENTION

It is an object of the present invention to provide a printed wiring board for a CSP, which overcomes the poor adhesion of solder balls to a base material which poor adhesion is caused by a decrease in the size of the solder balls.

It is another object of the present invention to provide a printed wiring board for a CSP in which the distortion of the printed wiring board is decreased and the distortion of a semiconductor plastic package formed by mounting a semiconductor chip on the printed wiring board by wire bonding or flip chip bonding is decreased.

It is further another object of the present invention to provide a printed wiring board for a CSP, which overcomes the degradation of heat resistance, electric insulation after water absorption and anti-migration properties, which degradation is caused by a decrease in the thickness, size and weight of packages.

According to the present invention 1, there is provided a printed wiring board for a semiconductor plastic package, which printed wiring board has, as a substrate for a chip scale package, a double-side copper-clad laminate formed of an insulation layer having a thickness of 0.2 mm or less and having copper foils on both surfaces, one copper foil on one surface and one copper foil on the other surface, wherein the double-side copper-clad laminate has an upper copper foil-surface and a lower copper foil surface, the upper copper foil surface has a wire bonding or flip chip bonding terminal for connecting a terminal of a semiconductor chip to said substrate, and has a copper pad in a position where the copper pad can be electrically connected to said wire bonding or flip chip bonding terminal and can be connected to a blind via hole formed in the lower copper surface, the lower copper foil surface has a solder-balls-fixing pad in a position corresponding to said copper pad, the solder-balls-fixing pad has at least 2 blind via holes within itself, and the solder-balls-fixing pad connected to a reverse surface of the copper pad with a conductive material is electrically connected to a conductive material with solder balls which are melted and filled in blind via holes so as to be mounded.

According to the present invention 1, further, there is provided a printed wiring board as described above, in which the insulation layer of the double-side copper-clad laminate is a film to which a thermosetting resin composition containing, as an essential component, a polyfunctional cyanate ester and a prepolymer of said cyanate ester is adhering or a multi-layered board of such films.

According to the present invention 1, further, there is provided a printed wiring board as described above, in which the insulation layer of the double-side copper-clad laminate is a laminated board formed by impregnating a reinforcing substrate with a thermosetting resin composition containing, as an essential component, a polyfunctional cyanate ester and a prepolymer of said cyanate ester, drying the impregnated reinforcing substrate to obtain prepreg sheets and laminate-forming the prepreg sheets.

According to the present invention 2, there is provided a printed wiring board for a semiconductor plastic package, which printed wiring board is formed by providing a copper-clad laminate formed of copper foils and a base material of a 150 $\mu$m to 40 $\mu$m thick glass fabric impregnated with a thermosetting resin composition, one copper foil on one surface of the substrate and one copper foil on the other surface of the substrate, arranging at least a semiconductor chip bonding terminal, a solder ball connecting pad, a copper foil circuit for connecting a bonding terminal and said pad and a through hole conductive material in the copper-clad laminate to form a circuit board, then, stacking prepreg sheets of glass fabric base material/thermosetting resin on the entire front and reverse surfaces, laminating the resultant set under pressure and under heat, and then removing base material formed of the glass fabric and the thermosetting resin composition on at least part of the surface of the bonding terminal and on at least part of the surface of the solder balls connecting pad, to expose a circuit.

According to the present invention 2, further, there is provided a printed wiring board for a semiconductor plastic package as described above, in which the glass fabric is at least one woven fabric having a thickness of 50±10 $\mu$m, a weight of 35 to 60 g/m$^2$ and a gas permeability of 5 to 25 cm$^3$/cm$^2$.sec.

According to the present invention 2, further, there is provided a printed wiring board for a semiconductor plastic package as described above, wherein the thermosetting resin composition is a thermosetting resin composition containing, as an essential component, a polyfunctional cyanate ester and a prepolymer of said cyanate ester.

According to the present invention, there is provided a printed wiring board for a CSP, which is excellent in the adhesion of solder balls to a substrate, and further, which is excellent in properties such as heat resistance, electric insulation after water absorption and anti-migration properties due to the use of the above-described resin.

DETAILED DESCRIPTION OF THE INVENTION

Symbols used in drawings attached to the present specification represent as follows. A shows a copper pad on an upper surface, b shows a blind via hole having a diameter of 100 $\mu$m, c shows solder balls, d shows a thermosetting resin layer reinforced with a base material of a glass fabric, e shows a solder ball pad on a lower surface, f shows a copper plating, g shows a plating resist, h shows a silver paste, i shows a semiconductor chip, j shows a bonding wire, k shows a sealing resin, l shows a bonding terminal, m shows a blind via hole conductive material, n shows a copper-plated surface which is a reverse surface of an upper-surface pad, o shows a copper foil, p shows a circuit, q shows a through hole, r shows a prepreg sheet, s shows a semiconductor chip bonding pad portion, t shows a solder ball pad portion, u shows an under fill resin, and v shows a bump.

According to the present invention 1, there is provided a printed wiring board for a CSP, which is excellent in the adhesion of solder balls to a substrate and further, which is excellent in properties such as heat resistance, electric insulation after water absorption and anti-migration properties due to the use of a specific resin.

According to the present invention 2, there is provided a printed wiring board for a CSP, which is decreased in the distortion of the printed wiring board and which is excellent in properties such as heat resistance, electric insulation after water absorption and anti-migration properties due to the use of a specific resin.

Figure 1A:
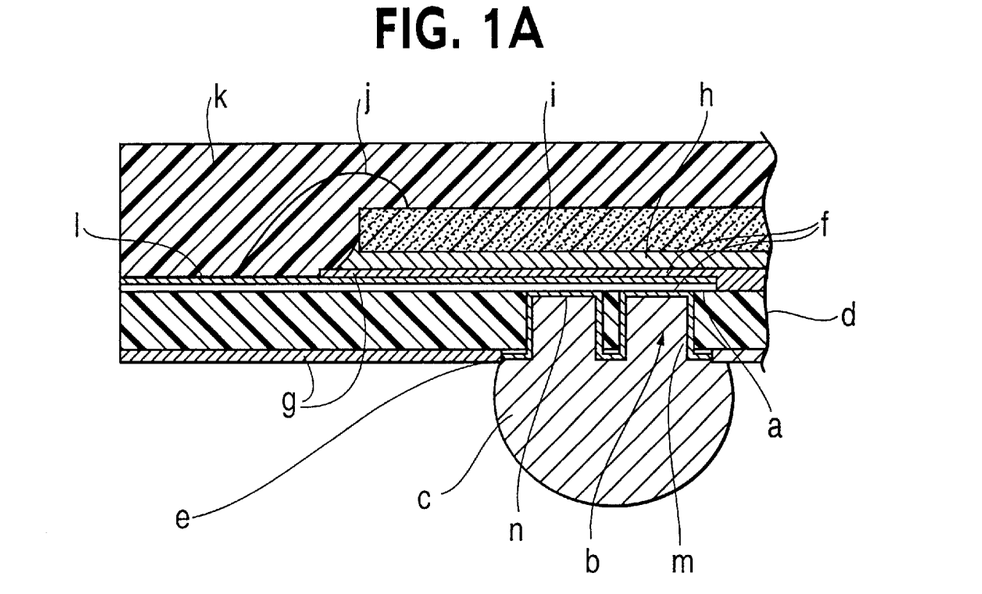
FIGS. 1A, B and C show a junction state of three blind via holes having a diameter of 0.1 mm each, made in a solder pad, and solder balls in Example 1.
Figure 1B:
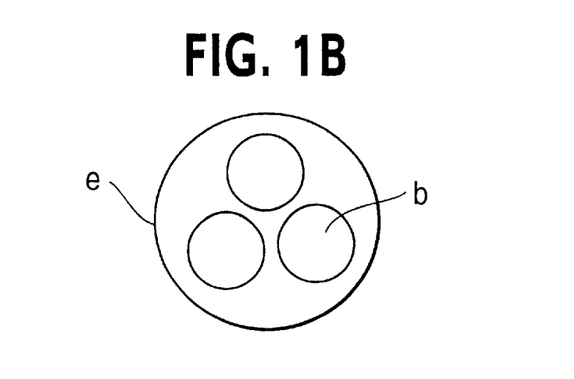
Figure 1C:
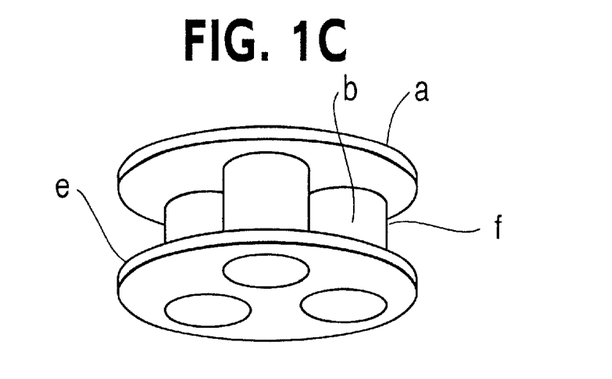

The constitution of the printed wiring board for a chip scale package, provided by the present invention 1, will be explained on the basis of a system in which a semiconductor chip and a printed wiring board are bonded by a wire bonding method with reference to FIGS. 1A, B and C.

As a substrate for a semiconductor chip size scale package, a double-side copper-clad laminate having a thickness of 0.2 mm or less is used. On one surface of the copper-clad laminate, a wire bonding terminal (1) is formed for connecting a terminal of the semiconductor chip and the above substrate. When a semiconductor chip and the printed wiring board are connected by a flip chip method, a flip chip bonding terminal (not shown) is formed.

An upper-surface copper pad (a) is formed in a position where the copper pad (a) can be connected to the above wire bonding terminal and can be connected to a lower surface through a conductive material (m) of a blind via hole (b) The upper-surface copper pad (a) is formed by utilizing a copper foil on the upper surface of the double-side copper-clad laminate. A solder ball fixing pad (e) is formed in a circumferential region of the blind via hole (b) on the lower surface side. The fixing pad (e) is formed by utilizing a copper foil on the lower surface of the double-side copper-clad laminate. The present invention has a characteristic feature in that at least two blind via holes are formed in one fixing pad (e). The copper pad (a) and the blind via hole conductive material (m) are electrically connected to each other. The blind via hole conductive material (m), a copper plating surface (n) on the reverse surface of the upper-surface copper pad (a) and the solder ball fixing pad (e) are integrated with a solder ball (c) melted and filled in the blind via holes (b). A semiconductor chip (i) is bonded and fixed onto a substrate with a thermally conductive adhesive such as a silver paste (h). The semiconductor chip (i) is connected to the bonding terminal (1) with a bonding wire (j). At least the semiconductor chip, the bonding wire and the bonding terminal are encapsulated with a sealing resin (k)

In the present invention 1, the material for the substrate is not critical. The above material can be selected, for example, from known materials such as a double-side copper-clad laminate formed by attaching copper foils to both surfaces of a film directly or with an adhesive, a multi-layered board of such laminates, a double-side copper-clad laminate having a thickness of 0.2 mm or less, formed by impregnating a non-woven or woven fabric of an organic or inorganic fiber with a thermosetting resin composition, drying the impregnated fabric to obtain prepreg, using one prepreg sheet or a stack of two or more prepreg sheets, placing copper foils on both the surfaces of the sheet(s), and bonding these under pressure and under heat, and a multi-layered board of such laminates.

The above organic fiber includes generally known fibers such as a liquid crystal polyester fiber and a wholly aromatic polyamide fiber. The inorganic fiber includes generally known glass fibers. A woven fabric or non-woven fabric of any one of the above fibers can be used. A commingled fiber of these may be also used.

The above film can be selected from generally known films. Specifically, it can be selected from a polyimide film or a parabanate film.

The method of making at least two blind via holes in one pad can be selected from known methods. For example, it can be selected, for example, from generally known methods such as a method in which holes having a small diameter each is made in a copper foil by etching beforehand and the holes are irradiated with a low-energy carbon dioxide gas laser having an energy of 5 to 18 mJ/pulse to make blind via holes having a particularly small diameter in a double-side copper-clad laminate, a method of making blind via holes in a double-side copper-clad laminate or a multi-layered board with a carbon dioxide gas laser, in which a surface irradiated with the laser is treated to form a metal oxide layer, an auxiliary material such as a coating composition containing at least one powder of a metal compound powder or a carbon powder, having a melting point of at least 900° C. and a bond energy of at least 300 kJ/mol, with a water-soluble resin is applied to the above surface to form a coating, or a hole-making auxiliary sheet prepared by attaching the auxiliary material to one surface of a thermoplastic film is arranged, preferably, so as to allow the auxiliary material to face a copper foil surface, and the copper foil surface is directly irradiated through the auxiliary material with a carbon dioxide gas laser to process and remove copper foil, a method of making holes with an excimer laser or a YAG laser, and a method of making holes with plasma. Preferably, the auxiliary material or the auxiliary sheet has a total thickness of 30 to 200 μm.

The auxiliary sheet for making holes with a carbon dioxide gas laser in the present invention may be used as it is. However, it is preferred to place the auxiliary sheet on a multi-layered board and keep it in tight contact with the multi-layered board as closely as possible during the making of holes for making holes having a good form. Generally, the auxiliary sheet is fixed and closely attached to the surface of a multi-layered board or a double-side copper-clad laminate with a tape, or the like. For achieving more complete contact of the auxiliary sheet to a multi-layered board or a double-side copper-clad laminate, preferably, the auxiliary sheet is attached to a multi-layered board or a double-side copper-clad laminate such that the resin-applied surface of the sheet faces the above board or laminate and they are laminated under heat and under pressure, or the resin-applied surface is wetted 3 μm or less deep with water in advance, the sheet is attached as described above and they are laminated at room temperature under pressure. In this case, the adhesion of the sheet to the copper foil surface is excellent, and holes having a good form can be made.

As a resin composition, a resin composition which is insoluble in water but is soluble in an organic solvent can be used as well. Since, however, such a resin composition may adhere to hole vicinities during the irradiation with a carbon dioxide gas laser, and in this case, not water but an organic solvent is required to remove the resin. Undesirably, therefore, the use of an organic solvent is troublesome in view of processing, and further, a contamination problem in a post-step is caused.

The substrate for use in the present invention, or the resin of the thermosetting resin composition used as part of the substrate can be selected from generally known thermosetting resin. Specifically, it is selected from an epoxy resin, a polyfunctional cyanate ester resin, a polyfunctional maleimide-cyanate ester resin, a polyfunctional maleimide resin, or an unsaturated-group-containing polyphenylene ether resin. These resins may be used alone or in combination. For making through holes having a good form by irradiation with a carbon dioxide gas laser having a high output, it is preferred to use a thermosetting resin composition having a glass transition temperature of 150° C. or higher. In view of humidity resistance, anti-migration and electric properties after water absorption, it is preferred to use a polyfunctional cyanate ester resin composition.

A polyfunctional cyanate ester compound which is a suitable thermosetting resin component in the present invention refers to a compound having at least 2 cyanato groups per molecule. Specific examples thereof include 1,3- or 1,4-dicyanatobenzene, 1,3,5-tricyanotobenzene, 1,3-, 1,4-, 1,6-, 1,8-, 2,6- or 2,7-dicyanatonaphthalene, 1,3,6-tricyanatonaphthalene, 4,4-dicyanatobiphenyl, bis(4-dicyanatophenyl)methane, 2,2-bis(4-cyanatophenyl) propane, 2,2-bis(3,5-dibromo-4-cyanatophenyl)propane, bis (4-cyanatophenyl)ether, bis(4-cyanatophenyl)thioether, bis (4-cyanotophenyl)sulfone, tris(4-cyanatophenyl)phosphite, and cyanates obtained by a reaction between novolak and cyan halide.

In addition to the above compound, there may be used polyfunctional cyanate ester compounds disclosed in Japanese Patent Publications Nos. 41-1928, 43-18468, 44-4791, 45-11712, 46-41112 and 47-26853 and JP-A-51-63149. Further, there may be used a prepolymer having a molecular weight of 400 to 6,000 and having a triazine ring formed by dimerizing cyanato group of any one these polyfunctional cyanate ester compounds. The above prepolymer is obtained by polymerizing the above polyfunctional cyanate ester monomer in the presence of an acid such as a mineral acid or a Lewis acid, a base such as sodium alcoholate or tertiary amine, or a salt such as sodium carbonate. The prepolymer partially contains unreacted monomer and is in the form of a mixture of a monomer and a prepolymer, and the prepolymer in the above form is also suitably used in the present invention. Generally, it is dissolved in an organic solvent in which it is soluble, before use.

The epoxy resin is generally selected from known epoxy resins. Specific examples thereof include a liquid or solid bisphenol A type epoxy resin, a bisphenol F type epoxy resin, a phenol novolak type epoxy resin, a cresol novolak type epoxy resin, an alicyclic epoxy resin, a polyepoxy compound obtained by epoxidizing the double bond of butadiene, pentadiene, vinylcyclohexene or dicyclopentyl ether, a polyol, and a polyglycidyl compound obtained by a reaction between a hydroxyl-group-containing silicone resin and epohalohydrin. These resins may be used alone or in combination.

The polyimide resin is generally selected from known polyimide resins. Specifically, it is selected from reaction products from polyfunctional maleimides and polyamines, and particularly from, polyimides having terminal triple bonds, disclosed in JP-B-57-005406.

The above thermosetting resins may be used alone, while it is preferred to use them in a proper combination by taking account of a balance of properties.

Various additives may be added to the thermosetting resin composition in the present invention so long as the inherent properties of the composition are not impaired. The above additives include monomers having polymerizable double bonds such as unsaturated polyester, prepolymers of these, liquid elastic rubbers having a low molecular weight or elastic rubbers having a high molecular weight such as polybutadiene, epoxidized butadiene, maleated butadiene, a butadiene-acrylonitrile copolymer, polychloroprene, a butadiene-styrene copolymer, polyisprene, butyl rubber, fluorine rubber and natural rubber, polyethylene, polypropylene, polybutene, poly-4-methylpentene, polystyrene, AS resin, ABS resin, MBS resin, styrene-isoprene rubber, a polyethylene-propylene copolymer, a 4-fluoroethylene-6-fluoroethylene copolymer, high-molecular-weight prepolymers or oligomers such as polycarbonate, polyphenylene ether, polysulfone, polyester and polyphenylene sulfide, and polyurethane. These additives are used as required. Further, various known additives such as an organic or inorganic filler, a dye, a pigment, a thickener, a lubricant, an anti-foamer, a dispersing agent, a leveling agent, a photo-sensitizer, a flame retardant, a brightener, a polymerization inhibitor and a thixotropic agent may be used alone or in combination as required. A curing agent or a catalyst is incorporated into a compound having a reactive group as required.

The thermosetting resin composition used in the present invention undergoes curing itself under heat. However, when it is poor in workability and economic performances, etc., due to its low curing rate, a known heat-curing catalyst is incorporated into the thermosetting resin. The amount of the catalyst per 100 parts by weight of the thermosetting resin is 0.005 to 10 parts by weight, preferably 0.01 to 5 parts by weight.

The metal compound having a melting point of at least 900° C. and a bond energy of at least 300 kJ/mol, used in an auxiliary material in the present invention, can be generally selected from known metal compounds. For example, oxides are used. The oxides include titanias such as titanium oxide, magnesias such as magnesium oxide, oxides of iron such as iron oxide, oxides of nickel such as nickel oxide, oxides of manganese such as manganese dioxide, oxides of zinc such as zinc oxide, silicon dioxide, aluminum oxide, rare earth metal oxides, oxides of cobalt such as cobalt oxide, oxides of tin such as tin oxide and oxides of tungsten such as tungsten oxide. Further, non-oxides may be used. The non-oxides include generally known oxides such as silicon carbide, tungsten carbide, boron nitride, silicon nitride, titanium nitride, aluminum nitride, barium sulfate, rare earth metal sulfides, aluminum hydroxide and magnesium hydroxide. Further, various glasses which are mixtures of metal oxide powders may be also used. Further, powders of simple substances of silver, aluminum, bismuth, cobalt, copper, iron, magnesium, manganese, molybdenum, nickel, palladium, antimony, silicon, tin, titanium, vanadium, tungsten and zinc or metals powders of alloys of these may be used. Further, a carbon powder may be used. These are used alone or in combination. The particle diameter of these is not specially limited, while it is preferably 1 μm or less.

When irradiated with a carbon dioxide gas laser, molecules are dissociated or melted to be dissipated. Preferred are therefore those which have no detrimental effect on a semiconductor chip or adhesion properties of a hole wall when they adhere to the hole wall, and the like. A powder containing Na, K or Cl ion is not preferred since it has a detrimental effect on the reliability of a semiconductor. The amount of the above powder is 3 to 97% by volume, preferably 5 to 95% by volume. Preferably, the above powder is incorporated into an aqueous solution and homogeneously dispersed.

The water-soluble resin in an auxiliary material is not specially limited, while it is selected from those which are not peeled off from a copper foil surface when kneaded, applied to the copper foil surface and dried or formed in a sheet. For example, it is selected from known resins such as polyvinyl alcohol, polyester, polyether and starch.

The method of preparing composition containing a metal compound powder, a carbon powder or a metal powder and a resin is not critical. The above method includes known method such as a method of kneading materials without any solvent at a high temperature with a kneader and extruding the kneaded mixture in the form of a sheet to bond it to a thermoplastic resin surface, and a method of dissolving a water-soluble resin in water, adding the above powder thereto, homogeneously mixing them with stirring, applying the mixture as a coating composition to a thermoplastic film surface and drying it to form a coating. The thickness of the sheet or the coating is not specially limited, while it has a total thickness of 30 to 200 μm after dried.

Further, there may be employed an embodiment in which a copper foil surface is treated to form a metal oxide and then holes are similarly made. In view of the form of the holes, however, it is preferred to use the above auxiliary material.

When the above auxiliary sheet is laminated on a copper foil surface under heat and pressure, the applied resin layer side thereof is attached to the copper foil surface, and the auxiliary sheet is laminated on the copper foil surface with a roll by melting the resin layer at a temperature generally between 40° C. and 150° C., preferably between 60° C. and 120° C. at a linear pressure of generally 0.5 to 30 kg, preferably 1 to 10 kg to attach the resin layer to the copper foil surface closely. The temperature to be employed differs depending upon the melting point of a selected water-soluble resin and also differs depending upon a selected linear pressure and a laminating rate. Generally, the lamination is carried out at a temperature higher than the melting point of the water-soluble resin by 5 to 20° C. When the auxiliary sheet is closely attached to the copper foil surface at room temperature, the applied resin layer surface is wetted 3 μm or less deep with water to dissolve the water-soluble resin to some extent, and the auxiliary sheet is laminated under the above pressure. The method of wetting the resin layer with water is not specially limited, while there may be employed, for example, a method of continuously applying water to an applied resin layer surface with a roll and then continuously laminating the auxiliary sheet onto the copper-clad laminate, or a method of continuously spraying water to a applied resin layer surface and then continuously laminating the auxiliary sheet onto the copper-clad laminate.

The reinforced multi-layered board is prepared as follows. First, a reinforcing material is impregnated with the thermosetting resin composition, and the impregnated reinforcing material is dried to B-stage the composition, whereby a prepreg is obtained. The reinforcing material is selected from an organic or inorganic non-woven or woven fabric. A predetermined number of the prepreg sheets are stacked, a copper foil is placed on at least one surface of the stacked prepreg sheets, and the resultant set is laminate-formed under heat and pressure to form a copper-clad laminate. The copper foil on each surface of the so-obtained copper-clad laminate preferably has a thickness of 3 to 12 μm. The copper foil as an inner layer preferably has a thickness of 9 to 35 μm.

As a multi-layered board, a copper-clad multi-layered board is used. The copper-clad multi-layered board is prepared by forming a circuit in a copper-clad laminate having a reinforced base material, treating a copper foil surface, then, arranging a B-staged prepreg having a reinforced base material or a resin sheet having no base material, a copper foil having a resin attached thereto and a resin layer formed by the application of a coating composition on at least one surface, placing a copper foil or copper foils on outermost surface or surfaces and laminate-forming the resultant set under heat and under pressure, preferably in vacuum. The reinforcing material preferably has a high density (substrate whose voids are decreased) when it has a small thickness. For example, a reinforcing material of a glass woven fabric having a thickness of 50 μm is to have a density of 50 to 60 g/m$^2$.

The solder ball pad on the reverse surface generally has a diameter of 200 to 500 μm, and at least 2 holes are made in the solder ball pad. The diameter of each hole is not critical, while it is generally 50 to 150 μm when a high-density printed wiring board is fabricated. Preferably, the holes are made with a carbon dioxide gas laser while the auxiliary material is arranged on the surface. The holes are made as blind via holes. Even if a hole penetrates part of a copper foil on the opposite surface, the so-made hole portion in the copper foil on the opposite surface is entirely or almost entirely filled with a panel plating to be carried out layer, so that the above hole portion has no influence on fabricating the printed wiring board.

When the auxiliary material is placed on the copper-clad laminate and directly irradiated with a laser energy, e.g., of 20 to 60 mJ/pulse to make holes having a diameter of about 100 μm. burrs of copper foil occur in the circumferential regions of the holes. When a very-high-density circuit is required, it is required to decrease the surface copper foils in thickness. After the irradiation with a carbon dioxide gas laser, preferably, the surfaces of the copper foils are etched two-dimensionally mechanically or with a chemical to remove part of each copper foil in the thickness direction. In this case, the burrs are also removed. The thus-prepared copper foils are suitable for forming fine patterns, and via holes which have copper foil remaining around each hole and are suitable for a high-density printed wiring board can be made. In this case, etching is more preferred than mechanical polishing, since the burrs on the hole portions can be easily removed and since the etching is free from dimensional changes caused by the polishing.

The method of removing the copper burrs occurring on the hole portions and removing part of surface copper foil in the thickness direction is not specially limited, and it includes methods of dissolving removing a metal surface with a chemical (called a SUEP method) disclosed, for example, in JP-A-02-00887, JP-A-02-22896, JP-A-02-25089, JP-A-02-25090, JP-A-02-60189, JP-A-02-166789, JP-A-03-25995, JP-A-03-60183, JP-A-03-94491, JP-A-04-199592 and JP-A-04-263488. The etching is generally carried out at a rate of 0.02 to 1.0 $\mu$m/second.

When the blind via holes are made with a carbon dioxide gas laser, it is possible to carry out irradiation with an energy selected from 20 to 60 mJ/pulse from beginning to end. However, when copper foils as a front surface and as an inner layer are first removed, preferably, a higher energy is selected for removing the copper foil, and an energy selected from 5 to 35 mJ/pulse depending upon the thickness of the copper foil is used for irradiation to form hole bottom portions of the holes. Conditions of making the holes may be varied depending upon whether or not a copper foil as an inner layer is present.

Copper plating can be carried out according to a generally known copper plating method. Further, the blind via holes may be partially filled with a plating.

The present invention 2 uses a double-side copper-clad laminate having a 150 $\mu$m to 40 $\mu$m thick glass fabric as a substrate. The present invention 2 provides a printed wiring board formed by arranging at least a semiconductor chip bonding terminal, a solder ball connecting pad, a copper foil circuit for connecting a bonding terminal and said pad and a through hole conductive material in the copper-clad laminate to form a circuit board, then, stacking prepreg sheets of glass fabric blase material/thermosetting resin on the entire front and reverse surfaces, laminating the resultant set under pressure and under heat, then removing glass fabric and thermosetting resin composition on at least part of the surface of the bonding terminal and on at least part of the surface of the solder balls connecting pad, to expose a circuit, optionally pre-treating the copper foil surface of the terminal and carrying out nickel plating and gold plating.

A semiconductor plastic package is formed as follows. A semiconductor chip is bonded and fixed to the surface of the above printed wiring board with a thermal-conductive adhesive, and connected thereto by wire bonding, and the surface is encapsulated with a sealing resin. Otherwise, a bump of the lower surface of a semiconductor chip is melted and attached to a terminal of the printed wiring board by flip chip bonding, the lower surface of the semiconductor chip is bonded and fixed with an under fill resin, and then, solder balls are melted and attached to the reverse surface of the printed wiring board.

When a polyfunctional cyanate ester resin composition is used as a thermosetting resin composition for the double-side copper-clad laminate, there can be obtained a printed wiring board excellent in heat resistance, electric insulation after treatment with a pressure cooker and anti-migration properties.

The double-side copper-clad laminate of the present invention 2 includes a double-side copper-clad laminate prepared by impregnating a generally known glass fiber woven fabric with a thermosetting resin and drying the impregnated glass woven fabric and a multi-layered board of such laminates. The glass fiber woven fabric includes generally woven fabrics of known glass fibers such as E, S and D glass fibers, and the glass fiber woven fabric generally has a thickness of 30 to 150 $\mu$m. The glass fabric is prepared by allowing a resin composition to adhere to a glass fiber, B-staging the resin composition under heat and forming a laminate having a thickness of 40 to 150 $\mu$m. Commingled products of filaments of these may be used as well. As a base material, a base material having a small thickness preferably has a high density. The base material has a thickness of 50±10 $\mu$m, a weight of 35 to 60 g/m$^2$ and a gas permeability of 5 to 25 cm$^3$/cm$^2$.sec. At least one of such base materials is used. Further, one glass fiber woven fabric having a thickness of 30 to 150 $\mu$m may be used. The weaving method is not critical, while a plain-woven fabric is preferred.

The resin for the thermosetting resin composition used in the present invention 2 is preferably selected from the thermosetting resins described with regard to the present invention 1.

An inorganic insulating filler may be used not only in the present invention 2 but also in the present invention 1. The inorganic insulating filler is selected from generally known fillers. Specific examples thereof include silicas such as natural silica, calined silica and amorphous silica, white carbon, titanium white, aerogel, clay, talc, wollastonite, natural mica, synthetic mica, kaolin, magnesia, alumina, perlite, aluminum hydroxide and magnesium hydroxide. The amount of the above filler based on the composition is 10 to 80% by weight, preferably 20 to 70% by weight. The inorganic insulating filler preferably has a particle diameter of 1 $\mu$m or less. In the present invention, a mixture of aluminum hydroxide with magnesium hydroxide is preferably used since the above mixture is suitable for imparting flame retardancy and for making holes with a carbon dioxide laser.

The copper-clad laminate having a base material of a glass fabric is prepared as follows. First, the base material is impregnated with a thermosetting resin composition, and the composition is B-staged to form a prepreg. Copper foils are placed on both the surfaces of the prepreg, and the resultant set is laminate-formed under heat and under pressure, preferably, in vacuum. Each of the copper foils on both the surfaces preferably has a thickness of 3 to 12 $\mu$m. The copper-clad laminate having a base material of a glass fabric having a thickness of 40 to 150 $\mu$m, used in the present invention 2, has no nerve due to its small thickness, and it is highly probably distorted due to a variability of solder resists on the upper and lower surfaces and a difference in copper foil remaining ratios. It is therefore poor in workability as a printed wiring board and it has a high defect ratio. The present invention 2 can provide a printed wiring board which is greatly improved in distortion, by arranging prepreg sheets of glass fabric base material/thermosetting resin on front and reverse surfaces of a printed substrate having a circuit and through holes and having chemically treated surfaces as required, instead of using the above resist, placing release films outside them, and integrating them by laminate-formation under heat and under pressure, preferably, in vacuum.

The glass fabric base material/thermosetting resin layer on part of the surface of the bonding terminal and on part of the surface of the solder ball connecting pad on the reverse surface is removed, preferably, by a sand blast method, then, the copper foil surfaces are treated, for example, by soft etching, and nickel plating and gold plating are carried out according to conventional methods. Naturally, the printed wiring board can be processed with a carbon dioxide gas laser.

In the printed wiring board for a semiconductor chip size scale package according to the present invention 1, there is provided a printed wiring board in which the shear strength of solder balls is greatly improved. Further, when a polyfunctional cyanate ester and a prepolymer of the polyfunctional cyanate ester is used as an essential component for a resin for the copper-clad laminate, there is provided a printed wiring board for a chip size scale package, which is excellent in heat resistance, electric insulation after treatment with a pressure cooker and anti-migration properties.

In the printed wiring board for a semiconductor plastic package according to the present invention 2, there can be obtained a printed wiring board in which the distortion of the printed wiring board is decreased and the distortion of a semiconductor plastic package having a semiconductor chip mounted by wire bonding or flip chip bonding is also decreased. Further, when a polyfunctional cyanate ester or a prepolymer of the polyfunctional cyanate ester is used as an essential component for the thermosetting resin composition, there is provided a printed wiring, which is excellent in heat resistance, electric insulation after treatment with a pressure cooker and anti-migration properties and which is also excellent in mass-producibility.

EXAMPLES

The present invention will be specifically explained with reference to Examples and Comparative Examples hereinafter, in which "part" stands for "part by weight" unless otherwise specified.

Example 1

900 Parts of 2,2-bis(4-cyanatophenyl)propane and 100 parts of bis(4-maleimidophenyl)methane were melted to 150° C. and allowed to react for 4 hours with stirring, to give a prepolymer. The prepolymer was dissolved in mixed solvents of methyl ethyl ketone and dimethylformamide. To the resultant mixture were added 400 parts of a bisphenol A type epoxy resin (trade name: Epikote 1001, supplied by Yuka-Shell Epoxy K.K.) and 600 parts of a cresol novolak type epoxy resin (trade name: ESCN-220F, supplied by Sumitomo Chemical Industry Co., Ltd.), and these materials were homogeneously dissolved and mixed. Further, as a catalyst, 0.4 part of zinc octylate was added, dissolved and mixed. To the resultant mixture were added 500 parts of an inorganic filler (trade name: Calcined Talc BST #200, supplied by Nippon Talc K.K.) and 8 parts of a black pigment, and these materials were homogeneously stirred and mixed to prepare a varnish A. A 50 $\mu$m thick glass woven fabric having a weight of 53 g/m$^2$ was impregnated with the above varnish, and the impregnated glass woven fabric was dried at 150° C. to prepare a prepreg (prepreg B) having a gelation time of 120 seconds (at 170° C.) and having a resin composition content of 51% by weight. Electrolytic copper foils having a thickness of 12 $\mu$m each were placed on upper and lower surfaces of combined two sheets of the above prepreg B, one copper foil on one surface and one copper foil on the other surface, and the resultant set was laminate-formed at 200° C. at 20 kgf/cm$^2$ under a vacuum of 30 mmHg or less for 2 hours, to give a double-side copper-clad laminate C having a total thickness (including the thickness of the copper foils) of 134 $\mu$m.

Separately, a varnish prepared by dissolving a polyvinyl alcohol powder in water was added to 800 parts of talc (average particle diameter: 0.4 $\mu$m, trade name: BST#200), and the mixture was homogeneously stirred. The mixture was applied to one surface of a 50 $\mu$m thick polyethylene terephthalate film so as to form a 30 $\mu$m thick coating, and the coating was formed by drying at 110° C. for 30 minutes to give an auxiliary material D having a talc content of 40% by volume. The auxiliary material was placed on the above copper-clad laminate such that the resin surface faced the copper foil side, and the auxiliary material was attached thereto under pressure with a hot roll at 100° C. 100 Holes were made in a 7 mm×7 mm square area in the copper foil by 1 pulse of irradiation directly with a carbon dioxide gas laser at an output of 40 mJ/pulse. Then, the output of the carbon dioxide gas laser was decreased to 20 mJ/pulse, and the hole bottoms were 1 pulse irradiated at an output of 20 mJ/pulse. Further, the via hole bottoms, i.e., the resin side of the copper foil on the upper surface were 1 shot irradiated at an output of 7 mJ/pulse to make 3 holes having a diameter of 100 $\mu$m each in a solder ball pad having a diameter of 300 $\mu$m (see b in FIGS. 1A, B and C). SUEP treatment was carried out to dissolve the copper until the copper foil had a remaining thickness of 5 $\mu$m, and the resultant board was placed in a plasma apparatus, treated in an oxygen atmosphere for 10 minutes and further treated in an argon atmosphere for 5 minutes to remove a remaining resin layer in the via holes and also to remove front layers of the copper foils on the front and reverse surfaces, whereby the board had a thickness of 4 $\mu$m. The resultant board was placed in a potassium permanganate aqueous solution, supersonically wet-treated and then subjected to general electroless plating and electroplating with copper (f and m in FIG. 1A). The resultant surface was soft-etched, circuits (line/space=50/50 $\mu$m) was formed in the front and reverse surfaces by a conventional method, and any region of the board was covered with a plating resist (g in FIG. 1A) with the exception of at least a semiconductor chip portion, a bonding pad portion (1 in FIG. 1A) and a solder ball pad portion (e in FIGS. 1A, B and C). The board was plated with nickel and gold to obtain a printed wiring board. A semiconductor chip (i in FIG. 1A) was bonded and fixed to the printed wiring board with a silver paste (h in FIG. 1A) and connected to the bonding pad (l in FIG. 1A) with a bonding wire (j in FIG. 1A), and encapsulation with a resin (k in FIG. 1A) was carried out. Further, a solder ball (c in FIG. 1A) was melt-attached. The thus-obtained printed wiring board was evaluated, and Table 1 shows the results.

Example 2

700 Parts of an epoxy resin. (trade name: Epikote 5045), 300 parts of an epoxy resin (trade name: ESCN-220F), 35 parts of dicyandiamide and 1 part of 2-ethyl-4-methylimidazole were dissolved in mixed solvents of methyl ethyl ketone and dimethyl formamide, and the mixture was homogeneously stirred. The same glass fabric as that used in Example 1 was impregnated with the above mixture, and the impregnated glass fabric was dried to give a prepreg E having a gelation time of 150 seconds.

Three sheets of the above prepreg E were combined, and 12 $\mu$m thick electrolytic copper foils were placed on both the surfaces of the combined sheets, one on one surface and one on the other surface. The resultant set was laminate-formed at 190° C. at 20 kgf/cm$^2$ under a vacuum of 30 mmHg or less to give a double-side copper-clad laminate having a thickness of 189 $\mu$m which includes the thickness of the copper foil. Three blind holes having a diameter of 125 $\mu$m each were similarly made, and 27% by volume of each of the blind holes were filled by pulse plating (Japan Lea Ronal method). Thereafter, a printed wiring board was prepared in the same manner as in Example 1, and a solder ball was connected. The thus-obtained printed wiring board was evaluated, and Table 1 shows the results.

Comparative Examples 1 and 2

Example 1 was repeated except that no blind hole or 1 blind hole having a diameter of 100 μm was made in a solder ball pad, to obtain a printed wiring board. The thus-obtained printed wiring board was evaluated, and Table 1 shows the results.

Comparative Example 3

Example 2 was repeated except that the glass fabric was replaced with a glass fabric having a weight of 48 g/cm² and a thickness of 50 μm to prepare a prepreg and that two sheets of the above prepreg were used instead of using three sheets of the prepreg E. However, the blind hole is not made in a solder ball pad. The thus-obtained printed wiring board was evaluated, and Table 1 shows the results.

TABLE 1

|  | Example | | Comparative Example | | |
| --- | --- | --- | --- | --- | --- |
|  | 1 | 2 | 1 | 2 | 3 |
| Glass transition temperature | 235 | 160 | 235 | 235 | 160 |
| Ball shear strength | 1.15 | 1.09 | 0.52 | 0.71 | 0.48 |
| Viscoelasticity | 2.0 | 1.9 | — | — | 1.0 |
| Insulation resistance (Ω) after pressure cooker treatment | | | | | |
| Normal state | $4 \times 10^{13}$ | | | $6 \times 10^{13}$ | |
| 200 hours after treatment | $6 \times 10^{12}$ | | | $2 \times 10^{12}$ | |
| 500 hours after treatment | $6 \times 10^{11}$ | | | $<1 \times 10^{11}$ | |
| 700 hours after treatment | $4 \times 10^{10}$ | | | — | |
| 1000 hours after treatment | $2 \times 10^{10}$ | | | — | |
| Anti-mirgration properties (Ω) | | | | | |
| Normal state | $6 \times 10^{13}$ | | | $\times 10^{13}$ | |
| 200 hours after treatment | $5 \times 10^{11}$ | | | $1 \times 10^{10}$ | |
| 300 hours after treatment | $3 \times 10^{11}$ | | | $4 \times 10^{9}$ | |
| 500 hours after treatment | $1 \times 10^{11}$ | | | $<1 \times 10^{8}$ | |
| 1000 hours after treatment | $9 \times 10^{10}$ | | | — | |
| Heat cycle test | 1.6 | 2.3 | — | 2.5 | — |

Notes: Glass transition temperature: ° C., Ball shear strength: kgf, Viscoelasticity: $\times 10^{10}$ dyne/cm²

<Measurement Method>
1) Glass transition temperature Measured according to DMA method.
2) Ball shear strength Measured under lateral tension.
3) Viscoelasticity Measured according to DMA method using a laminate of which copper foil was removed by etching.
4) Insulation resistance value after pressure cooker treatment
A comb-shaped pattern having a line/space=50/50 μm was formed, prepregs used were placed thereon, the resultant set was laminate-formed, the resultant laminate was treated at 121° C. under 2 atmospheric pressures for a predetermined period of time and then treated at 25° C. at 60%RH for 2 hours, 500 VDC was applied, and 60 seconds after the application, an insulation resistance between terminals was measured.
5) Anti-migration properties 50 VDC was applied to the same test piece as that in the above 4) at 85° C. at 85%RH, and an insulation resistance between terminals was measured.
6) Blind via hole heat cycle test 100 Pads having blind holes made therein were connected alternately from one source side to another surface side, and the connected pads were tested in 200 heat cycles each cycle of which consisted of immersion in solder at 260° C. for 30 seconds→room temperature for 5 minutes. A largest value of change ratio of resistance values is shown.

Example 3

The same varnish A as that used in Example 1 was prepared, and a varnish F was prepared in the same manner as in Example 1 except that the addition of 500 parts of the inorganic filler and 8 parts of the black pigment was omitted.

A 50 μm thick glass woven fabric (weight: 53 g/m², gas permeability: 7 cm³/cm².sec) was impregnated with the varnish A and the impregnated glass woven fabric was dried at 150° C. to obtain a prepreg G1 having a gelation time 120 seconds (at 170° C.) and having a resin composition content of 51% by weight or a prepreg G2 having a gelation time of 103 seconds and having a resin composition content of 60% by weight.

Figure 2:
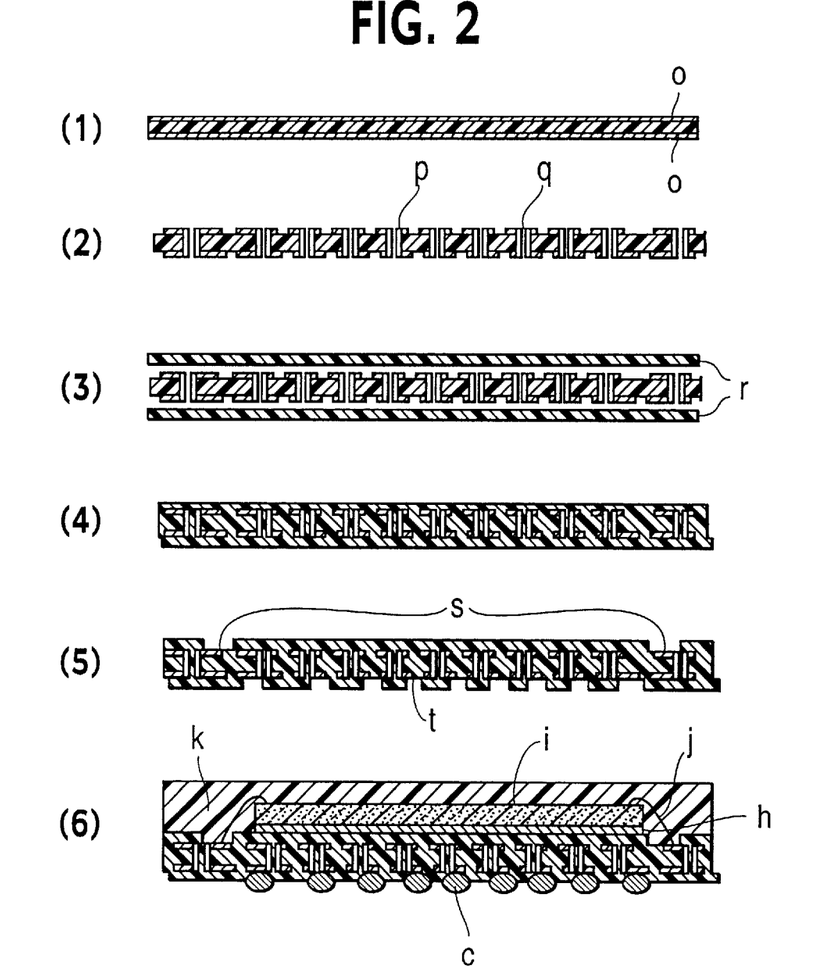
FIG. 2 shows steps of fabricating a printed wiring board and a semiconductor plastic package in Example 2.

Electrolytic copper foils (o in FIG. 2) having a thickness of 12 μm each were placed on both the surfaces of combined two sheets of the prepreg G1, and the resultant set was laminate-formed at 200° C. at 20 kgf/cm² under a vacuum of 30 mmHg or lower for 2 hours, to give a double-side copper-clad laminate H having an insulation layer thickness of 121 μm (step (1) in FIG. 2). Through holes (q in FIG. 2) having a diameter of 150 μm were made in the above double-side copper-clad laminate with a mechanical drill, and the whole of the double-side copper-clad laminate was plated with copper. Circuits (p in FIG. 2) were made on both the surfaces, the surfaces were treated to form black copper oxide, whereby a printed wiring board I was obtained (step (2) in FIG. 2). Sheets of the above prepreg G2 (r in FIG. 2) were placed on both the surfaces of the printed wiring board I, one sheet on one surface and one sheet on the other surface, release films were placed thereon, and the resultant set was similarly laminate-formed (step (3) in FIG. 2). Then, the release films were peeled off, and a liquid UV selecting thermosetting coating composition was applied to the entire front and reverse surfaces of the board and dried. Then, the board was UV irradiated with the exception of a bonding pad portion (s in FIG. 2) on the front surface and a ball pad portion (t in FIG. 2) on the reverse surface, to cure the coating composition. Development was carried out with an alkaline aqueous solution to remove the resist of the bonding pad portion and the ball pad portion (step (4) in FIG. 2), and the glass fabric base material/thermosetting resin composition was removed by a sand blast method, to expose a bonding pad and a solder ball pad (step (5) in FIG. 2). Then, the coating composition was dissolved to remove it. Then, the exposed copper foil surface was soft-etched, and nickel plating and gold plating were carried out according to conventional methods, to obtain a printed wiring board J having a 25 mm×25 mm square size. The printed wiring board J was evaluated, and Table 2 shows the results. As semiconductor chip (i in FIG. 2) having a 15 mm×15 mm square size was bonded to the surface of the printed wiring board with a silver paste (h in FIG. 2) and wire-bonded, and then, the entire surface was resin-sealed with an epoxy resin compound (k in FIG. 2), whereby a semiconductor plastic package K was obtained (step (6) in FIG. 2). The semiconductor plastic package was evaluated, and Table 2 shows the results.

Example 4

A mixture of 3,290 parts of aluminum hydroxide and 1,410 parts of magnesium hydroxide (average particle diameter 10.8 μm) was added to the same varnish F as that in Example 3, and these materials were fully stirred to give a varnish L. The same glass woven fabric as that used in Example 3 was impregnated with the varnish L to give a prepreg M having a gelation time of 150 seconds and a resin composition content of 71% by weight. Further, a prepreg N having a gelation time of 35 seconds and a resin composition content of 60% by weight was obtained. Two sheets of the prepreg N were combined, 12 μm thick electrolytic copper foils were placed on both the surfaces, one on one surface and one on the other surface, and the resultant set was laminate-formed, in the same manner as in Example 3, to give a double-side copper-clad laminate having an insulation layer thickness of 119 μm. A solution of a water-soluble polyether resin composition containing 40% by volume of a copper oxide powder (average particle diameter: 0.8 μm) in a mixture of water and methanol was applied to the surface of the above double-side copper-clad laminate so as to form a coating having a thickness of 40 μm, and the coating formed by drying. The coating was 4 shots irradiated with a carbon dioxide gas laser at an energy of 35 mJ/pulse to make through holes having a diameter of 100 μm, copper foil burrs occurring in hole portions and the copper foil surfaces were dissolved and removed, so that the copper foils had a thickness of 3 μm each and that the burrs were removed. The entire front, reverse surfaces and through holes were copper-plated 15 μm thick, to form circuits on both the surfaces. Sheets of the prepreg M were placed on both the surfaces, release films were placed thereon, the resultant set was similarly laminate-formed, and the release films were peeled off.

Figure 3:
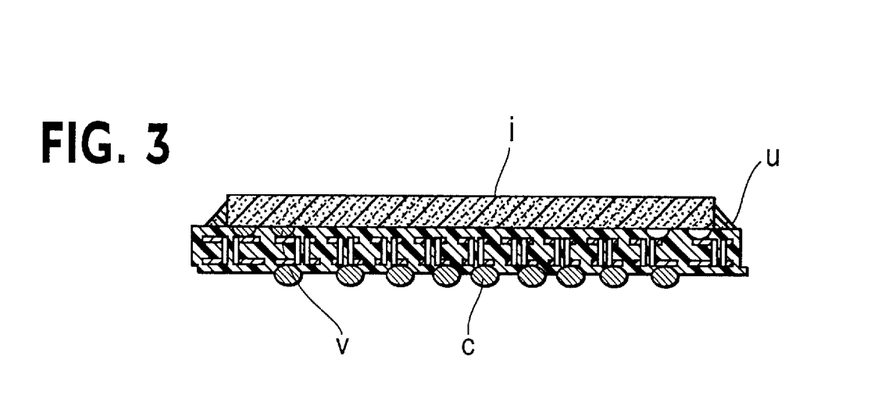
FIG. 3 shows a semiconductor plastic package using a printed wiring board in Example 4.

A UV resist was similarly applied to both the surfaces of the above-obtained laminate and dried. The laminate was irradiated with UV with the exception of a semiconductor flip chip bump portion on the front surface and a ball pad portion on the reverse surface, development with an alkaline aqueous solution was similarly carried out, glass fabric base material and thermosetting resin composition were removed by a sand blast method, the coating composition was removed, and nickel plating and gold plating were carried out, to obtain a printed wiring board O. The printed wiring board was evaluated, and Table 2 shows the results. A semiconductor chip having a 15 mm×15 mm square size was mounted on the above printed wiring board O having a 16 mm×16 mm square size by a flip chip bonding method, the lower side of the semiconductor chip was fixed by filling an under fill resin (u in FIG. 3), and solder balls were fixed to the reverse surface by melting them, to obtain a semiconductor plastic package P (FIG. 3). The semiconductor plastic package was evaluated, and Table 2 shows the results.

Comparative Example 4

A UV selective thermosetting resist was applied twice to both the surfaces of the same printed wiring board J as that prepared in Example 3 and dried so as to form coatings having a thickness of 50 μm, and after exposure, the resist in a semiconductor chip bonding pad portion and a solder ball pad portion on the reverse surface was removed by development. After the resist was cured under heat, nickel plating and gold plating were carried out, to obtain a printed wiring board Q. A semiconductor chip was similarly mounted on the printed wiring board Q, and wire bonding and encapsulation with a resin were carried out, to obtain a semiconductor plastic package R. The semiconductor plastic package was evaluated, and Table 2 shows the results.

Comparative Example 5

In Example 3, as a thermosetting resin composition, there was used a thermosetting resin composition prepared by dissolving 700 parts of an epoxy resin (trade name: Epikote 5045), 300 parts of an epoxy resin (trade name: ESCN-220F), 35 parts of dicyandiamide and 1 part of 2-ethyl-4-methylimidazole in mixed solvents of methyl ethyl ketone and dimethylformamide and homogeneously stirring the mixture. A glass fabric which was full of voids and had a weight of 48 g/m$^2$, a thickness of 51 μm and a gas permeability of 50 cm$^3$/cm$^2$.sec. was impregnated with the above thermosetting resin composition, to obtain a prepreg S having a gelation time of 150 seconds and a resin composition content of 55% by weight.

Two sheets of the above prepreg S were combined, 12 μm thick electrolytic copper foils were placed on both the surfaces, one copper foil on one surface and one copper foil on the other surface, and the resultant set was laminate-formed at 190° C. at 20 kgf/cm$^2$ under a vacuum of 30 mmHg or lower, to obtain a double-side copper-clad laminate. Thereafter, the double-side copper-clad laminate was processed in the same manner as in Comparative Example 1, to obtain a printed wiring board T. A semiconductor chip was mounted on the front surface, and wire bonding and encapsulation with a resin were carried out with regard to the front surface. Solder balls were bonded to the reverse surface, to obtain a semiconductor plastic package U. The semiconductor plastic package U was evaluated, and Table 2 shows the results.

TABLE 2

|  | Example | | Comparative Example | |
| --- | --- | --- | --- | --- |
|  | 3 | 4 | 4 | 5 |
| Glass transition temperature (° C.) | 235 | 235 | 235 | 160 |
| Viscoelasticity (× 10$^{10}$ dyne/cm$^2$) | 2.0 | 1.9 | — | 1.2 |
| Insulation resistance (Ω) after pressure cooker treatment | | | | |
| Normal | 4 × 10$^{14}$ | — | — | 6 × 10$^{14}$ |
| 200 hours after treatment | 6 × 10$^{12}$ | — | — | 2 × 10$^{11}$ |
| 500 hours after treatment | 6 × 10$^{11}$ | — | — | <1 × 10$^8$ |
| 700 hours after treatment | 4 × 10$^{10}$ | — | — | — |
| 1000 hours after treatment | 2 × 10$^{10}$ | — | — | — |
| Anti-mirgration properties (Ω) | | | | |
| Normal | 6 × 10$^{13}$ | — | — | 2 × 10$^{13}$ |
| 200 hours after treatment | 5 × 10$^{11}$ | — | — | 7 × 10$^9$ |
| 300 hours after treatment | 3 × 10$^{11}$ | — | — | <1 × 10$^8$ |
| 500 hours after treatment | 1 × 10$^{11}$ | — | — | — |
| 1000 hours after | 9 × 10$^{10}$ | — | — | — |

TABLE 2-continued

| | Example | | Comparative Example | |
|---|---|---|---|---|
| | 3 | 4 | 4 | 5 |
| treatment | | | | |
| Flame retardancy (UL94) | — | V-0 | — | — |
| Distortion (250 × 250 mm), Printed wiring board (mm) | | | | |
| J | 0.6 | | | |
| O | | 0.5 | | |
| P | | | 9 | |
| S | | | | 15 |
| Semiconductor plastic package (μm) | | | | |
| K | <150 | | | |
| P | | <150 | | |
| Q | | | 850 | |
| U | | | | 1,020 |

<Measurement Methods>

1) Distortion

Printed wiring board

A printed wiring board having a work size of 250×250 mm was placed on a base plate and measured for a maximum value of distortion.

Semiconductor plastic package

A semiconductor chip having a 15×15 mm square size was mounted on a printed wiring board having a 16×16 square size or a 25×25 square size, and the semiconductor plastic package was measured for a maximum value of distortion.

2) Flame retardancy

A copper foil of a printed wiring board was removed by etching, and the printed wiring board was tested according to UL94.

What is claimed is:

1. A printed wiring board for a semiconductor package, which printed wiring board is formed by providing a copper-clad laminate formed of copper foils and a base material of a 150 μm to 40 μm thick glass fabric impregnated with a thermosetting resin composition, one copper foil on one surface of the substrate and one copper foil on the other surface of the substrate, forming a semiconductor chip bonding terminal and a circuit for connecting said bonding terminal in the front surface of the copper-clad laminate, forming a solder ball connecting pad and a circuit for connecting said pad in the reverse surface of the copper-clad laminate, forming a through hole conductive material connecting the circuit in the front surface to the circuit in the reverse surface to form a circuit board, then, stacking prepreg sheets of glass fabric base material/thermosetting resin on the entire front and reverse surfaces, laminating the resultant set under pressure and under heat, and then removing base material formed of the glass fabric and the thermosetting resin composition on at least part of the surface of the bonding terminal and on at least part of the surface of the solder balls connecting pad, to expose a circuit.

2. A printed wiring board according to claim 1, which is a very thin BGA type semiconductor package.

3. The printed wiring board according to claim 1, wherein the glass fabric is at least one woven fabric having a thickness of 50±10 μm, a weight of 35 to 60 g/m$^2$ and a gas permeability of 5 to 25 cm$^3$/cm$^2$.sec.

4. The printed wiring board according to claim 1, wherein the base material formed of the glass fabric and the thermosetting resin composition on at least part of the surface of the bonding terminal and on at least of the surface of the solder balls connecting pad is removed by a sand blast method, to expose a circuit.

5. The printed wiring board according to claim 1, wherein the thermosetting resin composition is a thermosetting resin composition containing, as an essential component, a polyfunctional cyanate ester and a prepolymer of said cyanate ester.

6. The printed wiring board according to claim 1, wherein the resin composition of the copper-clad laminate contains 10 to 80% by weight of an insulating inorganic filler.

7. The printed wiring board according to claim 6, wherein the insulating inorganic filler is aluminum hydroxide or magnesium hydroxide.

* * * * *